Figure 1:
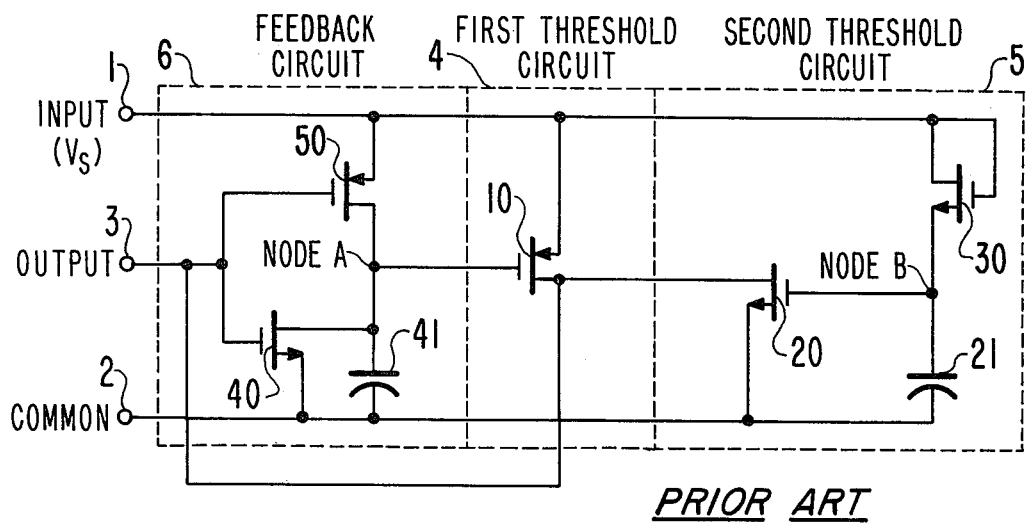

United States Patent [19]

Stewart

[11] 4,045,688
[45] Aug. 30, 1977

[54] POWER-ON RESET CIRCUIT

[75] Inventor: Roger Green Stewart, Neshanic Station, N.J.

[73] Assignee: RCA Corporation, New York, N.Y.

[21] Appl. No.: 735,253

[22] Filed: Oct. 26, 1976

[51] Int. Cl.² .................. H03K 17/22; H03K 17/20; H03K 21/32
[52] U.S. Cl. .................. 307/251; 307/200 B; 307/220 C; 307/246; 307/296 A; 307/360; 328/48
[58] Field of Search .................. 307/200 B, 208, 246, 307/247, 235 N, 251, 279, 296, 268, 220 C, 221 C, 225 C; 328/48; 58/23 A, 23 AC, 23 BA, 50 R

[56] References Cited

U.S. PATENT DOCUMENTS

| | | | |
|---|---|---|---|
| 3,809,926 | 5/1974 | Young | 307/237 X |
| 3,823,551 | 7/1974 | Riehl | 307/225 C X |
| 3,851,189 | 11/1974 | Moyer | 307/279 |
| 3,894,247 | 7/1975 | Jong | 307/246 X |
| 3,895,239 | 7/1975 | Alaspa | 307/251 X |
| 3,899,690 | 8/1975 | Llona et al. | 307/247 A X |
| 3,950,654 | 4/1976 | Broedner et al. | 307/208 |
| 4,001,609 | 1/1977 | Sickert | 307/246 X |

Primary Examiner—John S. Heyman
Assistant Examiner—Larry N. Anagnos
Attorney, Agent, or Firm—H. Christoffersen; A. L. Limberg; R. G. Coalter

[57] ABSTRACT

The circuit includes a MOS transistor for transmitting the applied voltage wave to the output signal terminal during the interval that the applied voltage is between two voltage limits and circuit elements responsive to the applied voltage wave exceeding the higher of these limits for disabling the MOS transistor and for clamping the output signal terminal to a reference level such as ground. The circuit elements include a pair of complementary MOS transistors connected such that the higher voltage limit is a value slightly higher than the highest of their respective threshold voltages but which may be less than the sum thereof.

7 Claims, 2 Drawing Figures

POWER-ON RESET CIRCUIT

This invention relates to switching circuits and particularly to "power-on reset" circuits.

A power on reset circuit, as that term is used herein, is a circuit which produces a momentary output signal upon initial application of power to the circuit or upon momentary interruptions of the power. Such circuits may be used, for example, for placing counters, registers, memories or other circuits in a desired initial condition.

Selection of a power on reset circuit for a particular application may involve one or more of the following criteria: static and dynamic response, operating voltage range, steady-state power dissipation, and ease of implementation in integrated circuit form. The static and dynamic response should be such that the circuit operation is essentially independent of the supply voltage rise time. The operating voltage range should be such that the reset circuit does not require more voltage than the device with which it is to be used which otherwise would limit the operating range of the utilization device. The steady state power dissipation should be minimal and, ideally, zero. Finally, the circuit should not require physically large elements (such as high valued capacitors) which would make implementation as an integrated circuit difficult if not impossible.

A known circuit which meets many of the above criteria is shown and described in U.S. Pat. No. 3,809,926 which issued to A. W. Young on May 7, 1974 and is titled "Window Detector Circuit". The present invention is directed to a new and improved circuit which includes additional advantageous operating characteristics discussed in detail below.

Figure 2:
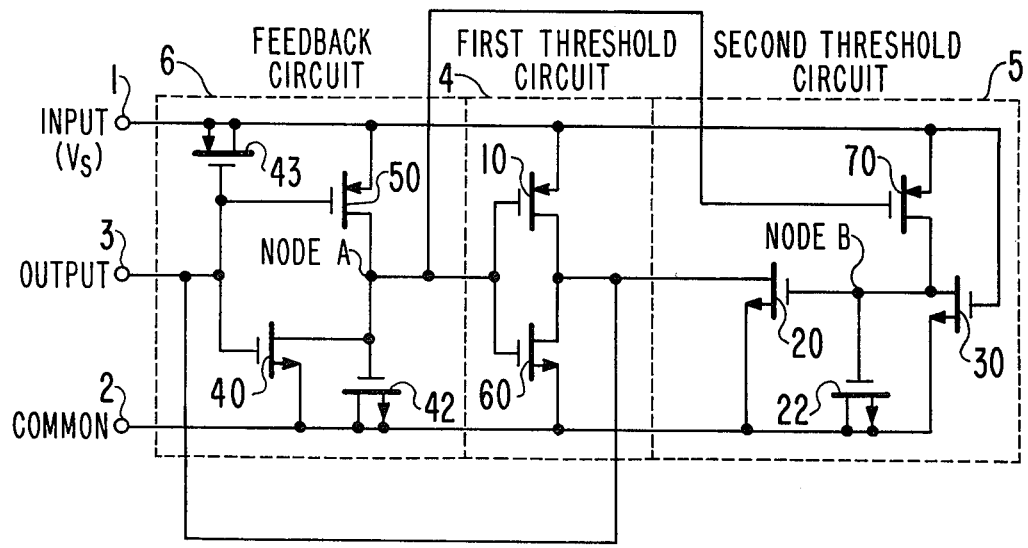

In the drawings:

FIG. 1 is a circuit diagram corresponding to FIG. 1 of the prior art patented circuit; and FIG. 2 is a circuit diagram of a power-on reset circuit embodying the invention.

The prior art circuit of FIG. 1 comprises a first threshold circuit 4, a second threshold circuit 5 and a feedback circuit 6. Threshold circuit 4 comprises a P channel field effect transistor 10 connected at the source, gate and drain electrodes thereof, respectively, to input terminal 1, node A and output terminal 3. Threshold circuit 5 comprises N channel FETs 20 and 30 and capacitor 21. FET 20 is connected at the source, gate, and drain electrodes thereof, respectively, to common terminal 2, node B and output terminal 3. FET 30 is connected at the gate and drain electrodes thereof to input terminal 1 and at the source electrode thereof to node B. Node B is coupled to common terminal 2 by a capacitor 21. Feedback circuit 6 comprises N channel FET 40, P channel FET 50 and capacitor 41. FETs 40 and 50 are connected at their gate electrodes to output terminal 3, at their drain electrodes to node A and at their source electrodes, respectively, to common terminal 2 and input terminal 1. Capacitor 41 is coupled between node A and common terminal 2.

In operation, a supply voltage, which may vary, is applied across terminals 1 and 2 with terminal 1 being at the more positive potential. To simplify the following explanation, it will be assumed that terminal 2 is at a reference potential of zero volts (ground) and that terminal 1 is connected to a supply voltage source (not shown) which may be at zero volts or some positive voltage, $V_s$. As a further simplification, it will be assumed that the threshold voltages of each P-channel transistor equals $V_{tP}$, that the threshold voltage of each N-channel transistor equals $V_{tN}$, and that the transconductance, gm, of transistor 20 (gm 20) is greater than that of transistor 10 (gm 10).

Assume initially that the supply voltage, $V_s$, is at zero volts and has been at that value for a period of time sufficient for nodal capacitors 21 and 41 to discharge. In this condition all transistors are off, output terminal 3 is electrically "isolated" from terminals 1 and 2, and transistors 10 and 30 are "primed" to turn-on by uncharged capacitors 41 and 21, respectively.

Assume now that the supply voltage begins to increase. When it equals $V_{tP}$, transistor 10 will turn on. Transistor 50 may also tend to turn on but is prevented from doing so by the combined effects of nodal capacitor 41 and transistor 10. Specifically, capacitor 41 prevents an immediate increase in the node A voltage if transistor 50 should turn on. Thus transistor 10 is assured of turning on prior to transistor 50 and when it does, it clamps output terminal 3 to the potential of supply terminal 1 which then inhibits turn on of transistor 50.

Transistors 30 and 40 may or may not turn on when $V_s = V_{tP}$ depending upon the relative values of $V_{tP}$ and $V_{tN}$, if $V_{tN} > V_{tP}$, both will remain off. Conversely, if $V_{tN} < V_{tP}$, both will turn on. Turn on of transistor 30 will have no immediate effect on circuit operation because it is connected as a "diode" and thus produces a voltage drop between terminal 1 and node B equal to its threshold voltage so that transistor 20 will remain off. Turn on of transistor 40 will remove any charge that may have accumulated on capacitor 41.

Summarizing to this point, when the supply voltage increases to $V_{tP}$, transistor 10 turns on which clamps output terminal 3 to supply terminal 1 and inhibits turn on of transistor 50. If, at this time, $V_{tN} < V_{tP}$, transistors 30 and 40 will also be on and transistor 20 will be off, otherwise transistors 20, 30 and 40 will all be off. This condition, $V_s = T_{tP}$, represents the beginning of the output pulse which may be used, as explained, for reset purposes.

As the supply voltage continues to increase, the voltage at node B (which equals $V_s - V_{tN}$) will begin to increase. When the node B voltage equals $2V_{tN}$ (i.e., the sum of the threshold voltages of transistors 20 and 30), transistor 20 will begin to turn on thereby reducing the voltage of output terminal 3 in proportion to the ratio of the transconductance of transistors 10 and 20. The terminal 3 voltage, however, is the input to an "inverter" formed by transistors 40 and 50, which inverter has a switching threshold proportional to the ration of the transconductances of its transistors (40 and 50). As $V_s$ continues to increase above $2V_{tN}$, a point will be reached where transistor 50 turns on and transistors 40 and 10 turn off. That point represents the end of the output pulse at which time output terminal 3 is clamped to ground by transistor 20. The circuit will remain in this condition until the power is turned off (i.e., $V_s$ is returned to zero volts) at which time the cycle may be repeated. It will be noted that, under quiescent conditions, the circuit power dissipation is zero since no conductive path exists between the supply terminal and either of the output or common terminals. Also, the circuit may be easily "integrated" because capacitors 21 and 41 may be very small (a few picofarads) since they are not used for timing purposes but only to bias nodes A and B, respectively.

With the above background in mind, consideration may now be given to the need for improvements of the prior art circuit. For example, in some applications it may be desired that the threshold of the second threshold circuit 5 be lower than $2V_{tN}$ and, preferably, equal to a value slightly greater than $V_{tN}$ or $V_{tP}$, whichever is larger. This feature would enable the circuit to reliably reset devices having a minimum operating voltage in the range slightly greater than the sum of $V_{tP}$ plus $V_{tN}$. As an example, some complementary MOS circuits are specified to operate with supply voltages as low as three volts. That value is slightly greater than the sum of the P and N transistor thresholds taking into account normal (expected) threshold voltage variations in the manufacturing process.

A further need exists for improving the static and dynamic circuit operation. For example, although (as will be explained) discharge of node A is not a serious problem with the prior art circuit, discharge of node B can, under some circumstances, adversely affect circuit operation. Also, transistor 50 may or may not tend to turn on when power is first applied depending on the nature of the load (not shown). Finally, optimum transconductance relationships may be selected which considerably enhance the circuit response to very slow rise time changes in $V_s$. All of the above needs are met with the circuit of FIG. 1 modified as shown in FIG. 2 and in the following description.

In FIG. 2, threshold circuit 4 has been modified to include a switch connected across output terminal 3 and common terminal 2 and controlled by the node A voltage for closing when the node A voltage is high. The switch comprises N-channel transistor 60 connected at the source, gate and drain electrodes thereof, respectively, to terminal 2, node A and terminal 3. Threshold circuit 5 has been modified to include means for disabling transistor 20 when the node A voltage is high and also means for clamping output terminal 3 to common terminal 2 when $V_s$ is greater than $V_{tP}$ or $V_{tN}$, whichever is the larger. Specifically, an N-channel transistor 70 has been added, connected at the source, gate and drain electrodes thereof, respectively, to terminal 1, node A and node B. Also, the source and drain of transistor 30 have been disconnected from node B and terminal 1 and are connected instead to terminal 2 and node B, respectively. Feedback circuit 6 has been modified to include means (transistor 43 connected as a capacitor) for initially biasing transistor 50 off. The source and drain electrodes of transistor 43 are connected to terminal 1 and its gate electrode is connected to terminal 3. Finally, insofar as the circuit diagram is concerned, capacitors 41 and 21 have been replaced by N-channel transistors 42 and 22 which are connected as capacitors. (Each "capacitor connected" transistor may comprise a plurality of transistors connected in parallel to achieve a desired specific value of capacitance).

Additional circuit modifications for improving the circuit response for low rise-time signals relate to preferred device parameter relationships. The preferred relationships are:

$gm\ 70 >> gm\ 30$  1.

$gm\ 20 >> gm\ 10$  2.

$L20 \approx L60 > L40; L50 > L10$  3.

$gm\ 60 + gm\ 20 \approx gm\ 40$  4.

In the above expressions $gm$ and $L$ represent transconductance and channel length, respectively, of the transistors identified by two digit numbers.

In the following discussion of operation of the circuit of FIG. 2, it will be assumed that terminal 2 is at ground and that the preferred device parameter relationships (expressions 1–4) are satisfied.

Assume initially that $V_s = 0$ and that "capacitors" 22, 42 and 43 are discharged. In this condition, as in the prior art circuit, all transistors are off. Output terminal 3, however, is not "isolated" from terminal 1 but is capacitively coupled thereto via "capacitor connected" transistor 43. If $V_s$ should increase rapidly, capacitor 43 (being initially uncharged) will cause the voltage at terminal 3 to increase momentarily thereby assuring turn-on of transistor 40 and inhibiting turn-on of transistor 50. (Recall that in the prior art circuit, there may be an ambiguity concerning the state of transistor 50 when $V_s$ is first applied.)

Assume now that $V_s$ increases from zero to a positive value, $V_1$, which is less than either $V_{tP}$ or $V_{tN}$. All transistors will still be off in this condition but drain-to-source leakage currents will begin to flow in each transistor. These currents are exceedingly small, but finite, and are greater in transistors 40 and 10 than in transistors 20 and 60 due to the differences in their conduction channel lengths (from inequality 3 transistors 10 and 40 have shorter channels than transistors 50 and 20, 60, respectively, hence greater drain-to-source leakage currents). Since the leakage of transistor 40 exceeds that of transistor 10, the voltage at node A will be less than $V_1/2$. Conversely, the voltage at output terminal 3 (assuming that either no load or a capacitive load is coupled thereto) will be greater than $V_1/2$ since the leakage of transistor 10 is greater than the sum of the leakages of transistors 20 and 60. The overall effect of this direct current biasing of output terminal 3 and node A when $V_s = V_1$ is to prime transistors 10 and 40 to turn on and transistors 20 and 60 to turn off when $V_s$ increases further. (Transistors 10, 40, 50 and 60 form, in effect, a flip-flop). An advantage of this method of biasing is that it is independent of the input signal rise time so that the circuit responds to very slowly varying input signals as well as fast rise-time signals (capacitor connected transistors 43 and 42 enhance the response speed as previously explained).

Assume now that $V_s$ increases to a value such that $V_s = V_2$, where $V_2$ is the larger of $V_{tP}$ or $V_{tN}$. In that case, transistors 40, 10, 30 and 70 will all be turned on and transistors 50, 60 and 20 will be maintained off. In more detail, transistors 40 and 10 are turned on because of the biasing effects previously described and are maintained on by regenerative feedback (transistor 40 clamps the gate of transistor 10 to common terminal 2 and transistor 10 clamps the gate of transistor 40 to supply terminal 1). This condition represents the beginning of the circuit output signal, that is, when $V_s = V_2$ output terminal 3 is clamped via transistor 10 to supply terminal 1.

At this point, $V_s = V_2$, transistor 20 is not turned on because of the voltage divider action provided by transistors 70 and 30, both of which are turned on. Preferably, the transconductances of transistors 70 and 30 are selected in accordance with inequality 1. If they are, the node B voltage will be slightly less than $V_s$. The steady state value of the node B voltage, $V_B$, may be approximated by:

$$V_B = V_s(gm\ 70)/(gm\ 30 + gm\ 70) \qquad 5.$$

As $V_s$ continues to increase, a point will be reached when $V_B$ equals the threshold voltage to transistor 20. Transistor 20 will then begin to conduct current from supply terminal 1 to common terminal 3 via the drain-source path of transistor 10 thereby causing a decrease in the output voltage at terminal 3. In other words, transistors 20 and 10 also form a voltage divider which decreases the output voltages when both transistors turn on. Preferably, the transconductance of transistor 20 exceeds that of transistor 10 (inequality 2, supra) so that when both transistors turn on the output voltage decreases to less than $V_s/2$. That value is approximately the switching point of the inverter formed by transistor 40 and 50 in feedback circuit 6 whereupon transistor 40 turns off and transistor 50 turns on.

When the inverter switches, the node A voltage changes from zero to $V_s$. Feedback from node A to the first threshold circuit turns on transistor 60 thereby clamping output terminal 3 to the potential of common terminal 1 and turns off transistor 10. Simultaneously, transistor 70 is also turned off but transistor 30 remains on to discharge node B and turn transistor 20 off. This condition (transistor 60 on, transistors 10, 20 and 70 off) represents the end of the circuit output pulse and since transistors 70, 10 and 40 are all off, the circuit steady state power dissipation is substantially zero. In other words, once the output pulse has been terminated, no direct current paths exist between terminals 1 and 2 so that the only power dissipated is that due to leakage currents.

As previously mentioned (inequality 4) it is preferred that the sum of the transconductances of transistors 20 and 60 equal that of transistor 40. This relationship equalizes the "pull down" drive applied to node A by transistor 40 with that applied to output terminal 3 by transistors 20 and 60. Stated another way, it enhances the "transconductance symmetry" of the flip flop formed by transistors 10, 20, 40, 50 and 60 and helps insure that the flip flop sets up into the preferred state independent of the rise time of $V_s$.

The circuit of FIG. 2 has a further advantage over the prior art circuit in terms of "recovery time", i.e., the time required to discharge both node A and node B. As an example, assume that capacitor 41 in FIG. 1 is charged to $V_s$ and that $V_s$ changes to zero volts. Since the gate and source electrode of P-channel transistor 50 are now negative with respect to its drain electrode the functions of those electrodes reverse (i.e., the source becomes the drain and vice versa) and capacitor 41 discharges through transistor 50 until its voltage equals $V_{tP}$ whereupon discharge continues via leakage current paths until the capacitor voltage is substantially zero. Node A in FIG. 2 is similarly discharged by transistor 50 but at a more rapid rate because when $V_s$ goes to zero volts, capacitor 43 applies $-V_s$ volts to the gate of transistor 50. Thus, the initial gate voltage of transistor 50 in FIG. 2 when $V_s$ decreases to zero may be as much as twice as negative as in the FIG. 1 circuit, whereby capacitor 42 is rapidly discharged.

Discharge of node B in the FIG. 1 circuit cannot occur through transistor 30 because it is an N-channel transistor. When $V_s$ goes to zero volts the gate of this transistor is negative with respect to node B which biases transistor 30 off. Discharge of node B thus is provided only via the leakage current paths associated therewith. In FIG. 2, however, when $V_s$ changes to zero volts, the discharge of node A places the gate of P-channel transistor 70 negative with respect to node B. Accordingly, transistor 70 is turned on and node B is rapidly discharged.

As an alternative to direct current biasing by selection of relative channel lengths (e.g., inequality 3), diodes may be connected in series with the conduction paths of transistors 20, 60 and/or 50 to effectively reduce their "leakages". As another alternative, direct current conductive impedances (e.g., resistors) may be connected in parallel with capacitor 43 and/or 42.

What is claimed is:

1. In a switching circuit of the kind comprising a first threshold circuit responsive to an input voltage for producing at its output terminal an output voltage corresponding to that portion of said input voltage of greater than a given magnitude, a second threshold circuit having a threshold higher than the first threshold circuit and responsive also to said input voltage for clamping said output terminal to a point of reference voltage when said input voltage exceeds the threshold of said second threshold circuit and feedback means responsive to signals present on said output terminal for providing a control signal to said first threshold circuit for inactivating said first threshold circuit when said output terminal is clamped to said point of reference voltage, the improvement for inactivating said second threshold circuit subsequent to the inactivation of said first threshold circuit, comprising:
   switch means coupled between said output terminal and said point of reference potential and responsive to said control signal for closing when said control signal is present; and
   means in said second threshold circuit responsive also to said control signal for disabling said second threshold circuit when said control signal is present.

2. The switching circuit recited in claim 1 wherein said switch means comprises a field effect transistor having a conduction path and a control electrode, said conduction path being connected between said output terminal and said point of reference voltage, said control electrode being coupled to said feedback means for receiving said control signal.

3. The switching circuit recited in claim 1 wherein said second threshold circuit comprises first and second complementary field effect transistors, the drain and source electrodes of the first being connected, respectively, to said output terminal and said point of reference voltage, the gate electrode of the first being connected to the drain electrode of the second, the source electrode of the second for receiving said input voltage and wherein said means for disabling said second threshold circuit comprises means for applying said control signal to the gate electrode of said second transistor.

4. The switching circuit recited in claim 1 wherein said second threshold circuit comprises first and second field effect transistors of a first conductivity type and a third field effect transistor of a second conductivity type, the source electrodes of the first and second transistors being connected to said point of reference potential, the drain electrode of the first transistor being connected to said output terminal, the gate electrode of the first transistor and the drain electrodes of the second and third transistors being connected together thereby forming a circuit node, and means for applying said input voltage to the source and gate electrodes, repectively, of said third and second transistors.

5. The switching circuit recited in claim 4 further comprising capacitor means coupled between said node and said point of reference voltage.

6. A power-on reset circuit comprising:
first, second and third P-channel field effect transistors and fourth, fifth, sixth, and seventh N-channel field effect transistors, each transistor having a source electrode, a gate electrode and a drain electrode;
an input terminal connected to the source electrodes of said first, second and third transistors and to the gate electrode of said seventh transistor;
a common terminal connected to the source electrodes of said fourth, fifth, sixth and seventh transistors;
an output terminal connected to the gate electrodes of said first and fourth transistors and to the drain electrodes of said second, fifth and sixth transistors;
a first circuit node connected to the drain electrodes of said first and fourth transistors and to the gate electrodes of said second, third and fifth transistors; and
a second circuit node connected to the gate electrode of said sixth transistor and to the drain electrodes of said third and seventh transistors.

7. The circuit recited in claim 6 further comprising:
first capacitor means connected between said input terminal and said output terminal;
second capacitor means connected between said first node and said common terminal; and
third capacitor means connected between said second node and said common terminal.

* * * * *